United States Patent
Lin et al.

(10) Patent No.: US 7,477,180 B2
(45) Date of Patent: Jan. 13, 2009

(54) NOISE SHAPING COMPARATOR BASED SWITCH CAPACITOR CIRCUIT AND METHOD THEREOF

(75) Inventors: Chia-Liang Lin, Union City, CA (US); Gerchih Chou, San Jose, CA (US)

(73) Assignee: Realtek Semiconductor Corp., HsinChu (TW)

( * ) Notice: Subject to any disclaimer, the term of this patent is extended or adjusted under 35 U.S.C. 154(b) by 288 days.

(21) Appl. No.: 11/278,432

(22) Filed: Apr. 3, 2006

(65) Prior Publication Data

US 2007/0236372 A1 Oct. 11, 2007

(51) Int. Cl.
 *H03M 1/12* (2006.01)
(52) U.S. Cl. .................................................. 341/172
(58) Field of Classification Search .............. 341/143, 341/150, 155, 161, 172; 327/157
See application file for complete search history.

(56) References Cited

U.S. PATENT DOCUMENTS 3,855,555 A * 12/1974 Burkhard et al. ............ 341/143
4,034,367 A * 7/1977 Sugiyama et al. ........... 341/131
4,400,637 A * 8/1983 Klar et al. ................... 327/336
5,006,854 A * 4/1991 White et al. ................. 341/172

OTHER PUBLICATIONS

Todd Sepke et al. "Comparator Based Switched-Capacitor Circuits For Sealed CMOS Technologies", ISSCC 2006 / Session 12 / Nyquist ADCs / 12.4, Digest of Technical Papers, Feb. 7, 2006, pp. 220-221, pp. 649, IEEE.

* cited by examiner

*Primary Examiner*—Brian Young
(74) *Attorney, Agent, or Firm*—Winston Hsu

(57) ABSTRACT

A noise shaping comparator based switch capacitor (CBSC) comprises a comparator, a charge pump, a plurality of capacitors, and a plurality of shufflers. Each shuffler is controlled by a logical signal to determine a polarity of connection for a circuit element within the CBSC circuit. The CBSC circuit operates cyclically through a sampling phase and a transfer phase. During the sampling phase, the CBSC circuit samples an input voltage; during the transfer phase, the CBSC circuit amplifies the sampled input voltage by a ratio and transfers a first resultant voltage to a load using the charge pump circuit. A noise induced by the CBSC circuit due to circuit non-idealities is thus modulated by the logical signal. The noise is therefore spectrally shaped into having a spectral characteristics determined by the logical signal.

20 Claims, 4 Drawing Sheets

NOISE SHAPING COMPARATOR BASED SWITCH CAPACITOR CIRCUIT AND METHOD THEREOF

CROSS-REFERENCE TO RELATED APPLICATIONS

This application is related to the following copending applications, owned by the assignee of this invention:
1) Lin, Ser. No. 11/277,939, for "ERROR CANCELLING COMPARATOR BASED SWITCH CAPACITOR CIRCUIT AND METHOD THEREOF"
2) Lin, Ser. No. 11/277,942, for "ERROR AVERAGING COMPARATOR BASED SWITCH CAPACITOR CIRCUIT AND METHOD THEREOF"

BACKGROUND OF THE INVENTION

1. Field of the Invention

The present invention relates to comparator based switch capacitor circuit, in particular to comparator based switch capacitor circuit that performs noise shaping on its circuit-induced error.

2. Description of Related Art

Comparator based switch capacitor (CBSC) circuit is an emerging technology that offers many advantages over conventional operational amplifier based switch capacitor circuit. Like a conventional switch capacitor circuit, a CBSC circuit also works in a two-phase manner. The two phases are "sampling" phase and "transfer" phase, controlled by two non-overlapping clocks, say $\phi_1$ and $\phi_2$, respectively. In a typical two-phase CBSC circuit working at a sampling rate of f, the duration of each phase is slightly less than half of the sampling clock period T=1/f. During sampling phase ($\phi_1$), an input voltage $V_I$ is sampled using a sampling capacitor $C_1$ by connecting the "+" end of $C_1$ to $V_I$ and the "−" end to a common mode voltage $V_{CM}$. During transfer phase ($\phi_2$), the charge stored on the sampling capacitor $C_1$ is transferred to an integrating capacitor $C_2$ via a charge transfer circuit comprising a comparator 130 and a charge pump (CP) 140, which includes a current source $I_1$ and a current sink $I_2$, as shown in FIG. 1. In FIG. 2, $C_L$ is a load capacitor for the CBSC circuit 100, $V_{DD}$ is a supply voltage, $V_{SS}$ is the lowest potential in the system. Note that $V_{CM}$ is the common mode voltage that is usually close to the mean value of $V_{DD}$ and $V_{SS}$. Also, $C_L$ is terminated to $V_{CM}$ via a sampling switch 150, which is controlled by a switch signal S. The purpose of the charge transfer circuit is to transfer the charge stored on $C_1$ to $C_2$ until the potentials on its two ends are equal, i.e. $V_X=V_{CM}$. The principle of the CBSC circuit 100 during transfer phase ($\phi_2$) is briefly described as follows.

At the beginning of the charge transfer phase, a brief preset (P) must be performed to clear $C_L$ and ensure the voltage $V_X$ is below $V_{CM}$. The preset is done by momentarily pulling the output node $V_O$ to $V_{SS}$, the lowest potential in the system. Next, a coarse charge transfer phase ($E_1$) begins. During coarse charge transfer phase, $V_X<V_{CM}$ and CP 140 turns on the current source $I_1$ to inject charge into the circuit comprising $C_L$, $C_2$, and $C_1$, resulting in a relatively fast voltage ramp on $V_X$ toward $V_{CM}$. CP 140 continues to inject charge until comparator 130 detects $V_X>V_{CM}$. At the instant where comparator 130 detects $V_X>V_{CM}$, a fine charge transfer phase ($E_2$) commences by turning off the current source $I_1$ and turning on the current sink $I_2$ to drain charge from the circuit comprising $C_L$, $C_1$, and $C_2$. One deliberately chooses $I_2$ to be lower than $I_1$, resulting in a relatively slow voltage ramp down on $V_X$ back toward $V_{CM}$. At the instant where the comparator 130 detects $V_X<V_{CM}$ again, the sampling switch 150 is opened and the charge stored on $C_L$ is sampled and frozen.

FIG. 2 depicts a typical timing diagram for the CBSC circuit 100 for the charge transfer phase. Initially the switch signal S is asserted. As a result, the sampling switch 150 is closed and the load $C_L$ is terminated to $V_{CM}$. In the mean while, $V_O$ stays at the sampled level from the previous cycle and $V_X$ is close to $V_{CM}$. The transfer phase $\phi_2$, starting at time $t_1$ and ending at time $t_5$, comprises four sub-phases: preset (P), coarse charge transfer ($E_1$), fine charge transfer ($E_2$), and hold (H). The CBSC circuit 100 first enters the P phase (at time $t_1$), where it pulls the output node $V_O$ to $V_{SS}$ and causes $V_X$ to drop to $V_{XO}$, which is below $V_{CM}$. At time $t_2$, it enters the $E_1$ phase, where comparator detects $V_X<V_{CM}$ and CP 140 injects charge into the circuit comprising $C_L$, $C_2$, and $C_1$, resulting in relatively fast voltage ramp up on both $V_O$ and $V_X$. The $E_2$ phase starts at time $t_3$, the instant where comparator 130 detects $V_X>V_{CM}$. Note that due to circuit delay, $t_3$ slightly trails the exact time instant where $V_X$ rises past $V_{CM}$. During the $E_2$ phase, CP 140 drains charge from the circuit comprising $C_L$, $C_2$, and $C_1$, resulting in a relatively slow voltage ramp down on both $V_O$ and $V_X$. Finally, the CBSC circuit 100 enters the H phase at time $t_4$, where comparator 130 detects $V_X<V_{CM}$ again. Again, due to circuit delay, $t_4$ slightly trails the exact time instant where $V_X$ falls past $V_{CM}$. During the H phase, S is de-asserted and thus the charge stored on CL is frozen, and also charge pump circuit CP 140 is disabled.

There are two problems associated with the prior art CBSC circuit 100. First, there is always an error on the final sampled value of $V_O$, due to the circuit delay. As clearly seen in FIG. 2, the actual sampled value is always slightly lower than the ideal sample value, which is the value at the exact time instant where $V_X$ falls past $V_{CM}$. Second, the prior art CBSC circuit 100 is subject to error due to the offset in the comparator 130.

The error due to comparator offset or circuit delay may degrade the system performance. Besides, both comparator 130 and charge pump 140 also generate noises, in particular a low frequency noise known as "flicker noise."

Fortunately, for an over-sampling system such as a delta-sigma ADC, the error due to comparator offset and circuit delay, along with any low frequency circuit noise, can be made irrelevant if a spectral shaping operation can be performed on the error.

What is needed is a method to spectrally shape a noise or error due to circuit non-idealities for a CBSC circuit.

BRIEF SUMMARY OF THIS INVENTION

In an embodiment, a noise shaping comparator based switch capacitor (CBSC) circuit is disclosed. The CBSC circuit comprises a comparator, a charge pump, a plurality of capacitors, and a plurality of shufflers. Each shuffler is controlled by a logical signal to determine a polarity of connection for a circuit element within the CBSC circuit. The CBSC circuit operates cyclically through a sampling phase and a transfer phase. During the sampling phase the CBSC circuit samples an input voltage; during the transfer phase the CBSC circuit amplifies the sampled input voltage by a ratio and transfers a first resultant voltage to a load using the charge pump circuit. A noise induced by the CBSC circuit due to circuit non-idealities is spectrally modulated by the logical signal.

In an embodiment, a method of spectrally shaping a circuit noise induced in a comparator based switch capacitor (CBSC) circuit is disclosed. The CBSC circuit comprises a comparator, a charge pump, and a plurality of capacitors. The method comprises: generating a modulating logical signal;

operating the CBSC circuit through a sampling phase and a transfer phase; sampling an input voltage during the sampling phase; and amplifying the sampled input voltage by a ratio and transferring a resultant voltage to a load using a charge pump circuit during the transfer phase using a configuration of circuit connection determined by the modulating logical signal. A noise induced by the CBSC circuit due to circuit non-idealities is spectrally modulated by the logical signal.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to noise shaping for comparator based switch capacitor (CBSC) circuit. While the specifications describe several example embodiments of the invention considered best modes of practicing the invention, it should be understood that the invention can be implemented in many ways and is not limited to the particular examples described below or to the particular manner in which any features of such examples are implemented.

The present invention is general and applicable to any sampled-data analog circuit. However, the present invention is most useful to an over-sampling system such as a delta-sigma ADC (analog-digital converter). A sampled-data analog circuit usually works in a multi-phase manner. By way of example but not limitation, a two-phase switch-capacitor circuit in accordance with the present invention is disclosed. Like the prior art described earlier, the two phases are sampling phase ($\phi_1$) and transfer phase ($\phi_2$).

Figure 1:
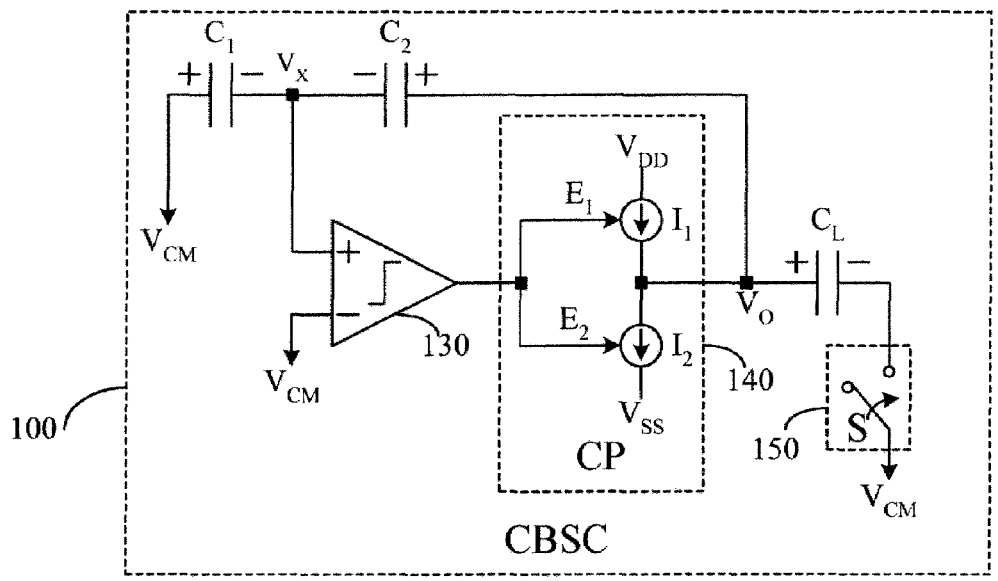
FIG. 1 depicts a prior art comparator based switch capacitor (CBSC) circuit during transfer phase.
Figure 2:
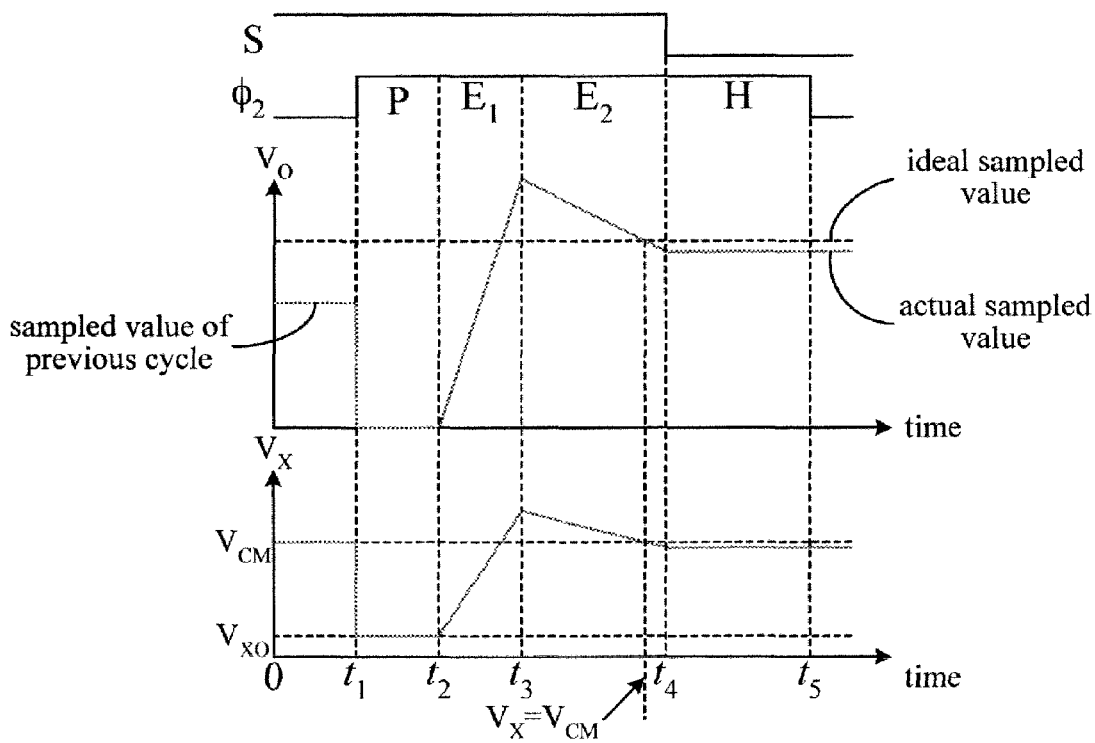
FIG. 2 depicts a typical timing diagram for the CBSC circuit depicted in FIG. 1.
Figure 3:
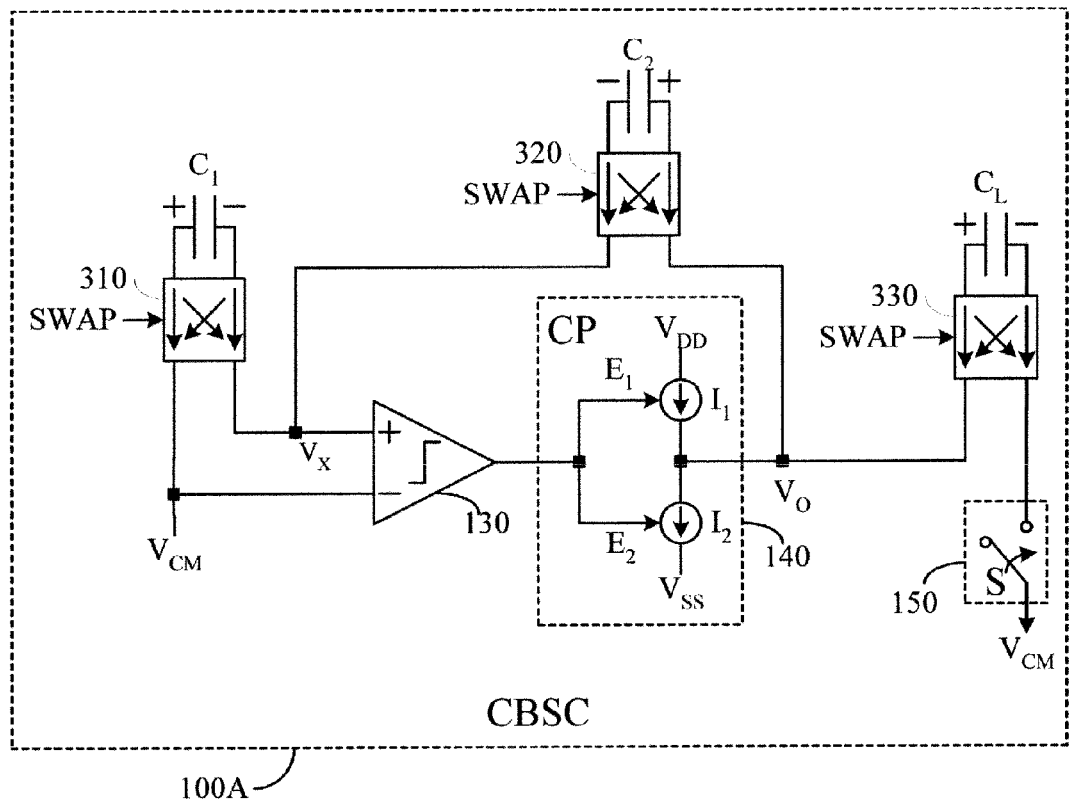
FIG. 3 depicts an embodiment of a CBSC circuit during a transfer phase in accordance with the present invention.

The present invention discloses a method to spectrally shape the noise due to comparator offset, circuit delay, and a low frequency noise (e.g. flicker noise) in the prior art CBSC circuit 100 by shuffling a polarity of connection for a plurality of capacitors, including a sampling capacitor, an integrating capacitor, and a load capacitor. During sampling phase ($\phi_1$), the "+" end of a sampling capacitor $C_1$ is connected to the input voltage $V_I$, while the "–" end of $C_1$ is connected to a common mode voltage $V_{CM}$. The circuit configuration during transfer phase ($\phi_2$) is depicted in FIG. 3. Here, one uses a CBSC circuit 100A that is exactly the same as the prior art CBSC 100 circuit shown in FIG. 1 except that three shufflers 310, 320, and 330 are used to conditionally reverse a polarity of connection for $C_1$, $C_2$, and $C_L$, respectively. All these three shufflers are controlled by a logical signal SWAP, which has two states. Whenever the logical signal SWAP is de-asserted, all three shufflers are set to a "straight connection" configuration, e.g. the "+" end of $C_1$ is connected to $V_{CM}$ and the "–" end of $C_1$ is connected to $V_X$. Whenever the logical signal SWAP is asserted, all three shufflers are set to a "reverse connection" configuration, e.g. the "+" end of $C_1$ is connected to $V_X$ and the "–" end of $C_1$ is connected to $V_{CM}$. Other than the polarity reversion, CBSC 100A works in exactly the same manner as that of CBSC 100. That is, we first performs a preset (P) to force $V_X < V_{CM}$, then perform a coarse transfer ($E_1$) until $V_X > V_{CM}$ is detected, then perform a fine transfer ($E_2$) until $V_X < V_{CM}$ is detected again, finally hold (H) the charges on all capacitors. At the end of the transfer phase ($\phi_2$), the charge stored on load $C_L$ contains an error due to comparator offset and circuit delay.

Let the comparator offset be $V_{OS}$ (i.e. comparator 130 favorably gives the "–" end an advantage in an amount of $V_{OS}$ when performing comparison.) Let the current draining from $C_2$ during $E_2$ be I. Also, let the circuit delay between the exact time instant where $V_X$ falls past $V_{CM}$ and the actual time instant where comparator 130 detects $V_X < V_{CM}$ be $\tau$. Let the charge on $C_2$ before charge transfer phase be $Q_2^{(init)}$.

Consider first the case where SWAP is de-asserted (SWAP=0). At the end of charge transfer, the charges stored on $C_1$ and $C_2$ are $Q_1^{(0)} = -C_1 V_{OS} + I\tau$ and $Q_2^{(0)} = Q_2^{(init)} + C_1 (V_{OS} + V_I - V_{CM}) - I\tau$, respectively. The output voltage is then $$V_O^{(0)} = V_{CM} - \frac{Q_1^{(0)}}{C_1} + \frac{Q_2^{(0)}}{C_2}$$

$$= V_{CM} + \frac{Q_2^{(init)}}{C_2} + \frac{C_1}{C_2}(V_I - V_{CM}) + \left(1 + \frac{C_1}{C_2}\right)\left(V_{OS} - \frac{I\tau}{C_1}\right)$$

The charge stored on $C_L$ at the end of charge transfer is then:

$$Q_L^{(0)} = C_L(V_O^{(0)} - V_{CM})$$

$$= C_L\left[\frac{Q_2^{(init)}}{C_2} + \frac{C_1}{C_2}(V_I - V_{CM}) + \left(1 + \frac{C_1}{C_2}\right)\left(V_{OS} - \frac{I\tau}{C_1}\right)\right]$$

Then consider the case where SWAP is asserted (SWAP=1). At the end of charge transfer, the charges stored on $C_1$ and $C_2$ are $Q_1^{(1)} = C_1 V_{OS} - I\tau$ and $Q_2^{(1)} = Q_2^{(init)} - C_1 (V_{OS} - V_I + V_{CM}) + I\tau$, respectively. The output voltage is then $$V_O^{(1)} = V_{CM} + \frac{Q_1^{(1)}}{C_1} - \frac{Q_2^{(1)}}{C_2}$$

$$= V_{CM} - \frac{Q_2^{(init)}}{C_2} - \frac{C_1}{C_2}(V_I - V_{CM}) + \left(1 + \frac{C_1}{C_2}\right)\left(V_{OS} - \frac{I\tau}{C_1}\right)$$

The charge stored on $C_L$ at the end of charge transfer is then:

$$Q_L^{(1)} = C_L(V_{CM} - V_O^{(1)})$$

$$= C_L\left[\frac{Q_2^{(init)}}{C_2} + \frac{C_1}{C_2}(V_I - V_{CM}) - \left(1 + \frac{C_1}{C_2}\right)\left(V_{OS} - \frac{I\tau}{C_1}\right)\right]$$

It is obvious that the error term, due to comparator offset ($V_{OS}$) and circuit delay ($I\tau$), in the case where SWAP=0 is exactly opposite to the error term in the case where SWAP=1. The same conclusion can be said for other circuit errors such as a flicker noise.

In an embodiment, the SWAP signal toggles its state every time the CBSC circuit 100A completes a sampling-transfer cycle. That is, if SWAP is 0 during current sampling-transfer cycle, then SWAP will be 1 during next sampling-transfer cycle; if SWAP is 1 during current sampling-transfer cycle, then SWAP will be 0 during next sampling-transfer cycle. Using this arrangement, a circuit-induced error will be modulated into a high frequency noise that becomes irrelevant in an over-sampling system.

In another embodiment, the SWAP signal is a pseudo-random noise (PN) sequence. Using this arrangement, a circuit-induced error will be modulated into a random noise.

For those of ordinary skill in the art, the principle disclosed by the present invention can be practiced in various alternative forms, including the following:

1. In an embodiment, one may pull the output voltage $V_O$ to $V_{DD}$, the highest potential of the system, during the preset (P) phase, thus forcing the condition $V_X > V_{CM}$ before entering the coarse transfer phase ($E_1$). In that scenario, $I_1$ needs to be changed to a current sink while $I_2$ needs to be changed to a current source.
2. In an embodiment, one may totally eliminate the fine transfer phase $E_2$, as the error due to circuit delay can be spectrally shaped and thus there is no need to use a fine transfer to reduce the error caused by circuit delay. In this case, the $I_2$ current is eliminated, and the overall operation speed of the switch capacitor circuit improves.
3. In an embodiment, during the transfer phase ($\phi_2$), one end of capacitor $C_1$ in FIG. 3 is connected to $V_X$, while the other end may be connected to a voltage different from $V_{CM}$. For example, for a pipeline ADC application, the other end may be connected to one of a plurality of predefined voltages depending on the range of the voltage $V_I$. The principle taught by the present invention, however, applies equally well to that scenario.
4. In a further embodiment, the capacitor $C_1$, is implemented using a plurality of capacitors, which are connected in parallel during the sampling phase ($\phi_1$). During transfer phase, for each of said capacitors, one end ("+" or "−" depending on SWAP) is connected to $V_X$, while the other end is connected to a predefined voltage or a voltage of an internal node of the system.

Figure 4:
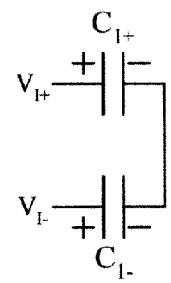
FIG. 4 depicts a differential circuit embodiment of a CBSC circuit during a sampling phase in accordance with the present invention.
Figure 5:
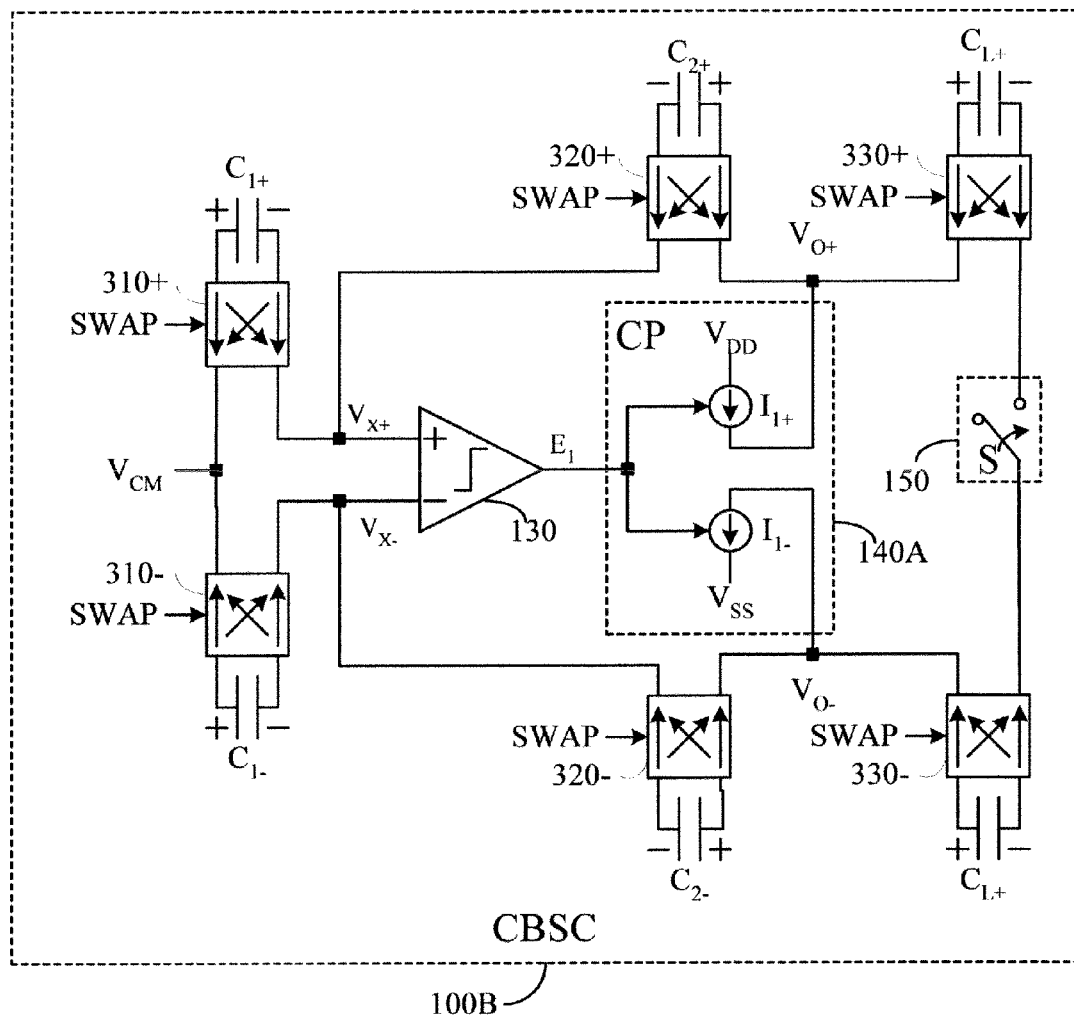
FIG. 5 depicts a differential circuit embodiment of a CBSC circuit during a transfer phase in accordance with the present invention.

In an embodiment, one may also use a differential circuit instead of a single-ended circuit. FIG. 4 depicts an embodiment of a differential circuit during the sampling phase, where a pair of sampling capacitors $C_{1+}/C_{1-}$ samples a differential input voltage $V_{I+}/V_{I-}$. FIG. 5 depicts an embodiment of a differential circuit CBSC 100B during the transfer phase, where the charges stored on $C_{1+}/C_{1-}$ are transferred to a pair of integrating capacitors $C_{2+}/C_{2-}$ using the differential charge pump circuit CP 140A. The transfer phase comprises three sub-phases: preset (P), coarse charge transfer ($E_1$) and hold (H). Although a fine transfer phase $E_2$ is not included here, those of ordinary skill in the art may include a fine transfer phase by adding a current source $I_{2+}$ and a current sink $I_{2-}$ that are both controlled by $E_2$. During preset (P), $V_{O+}$ is pulled to $V_{SS}$ and $V_{O-}$ is pulled to $V_{DD}$, forcing $V_{X+} < V_{X-}$. During coarse charge transfer ($E_1$), $V_{X+} < V_{X-}$ and CP 140A injects charge into $V_{O+}$ and drains charge from $V_{O-}$ until comparator 130 detects $V_{X+} > V_{X-}$. Then it enters hold (H) phase, where switch 150 is turned off and CP 140A is disabled.

Figure 6:
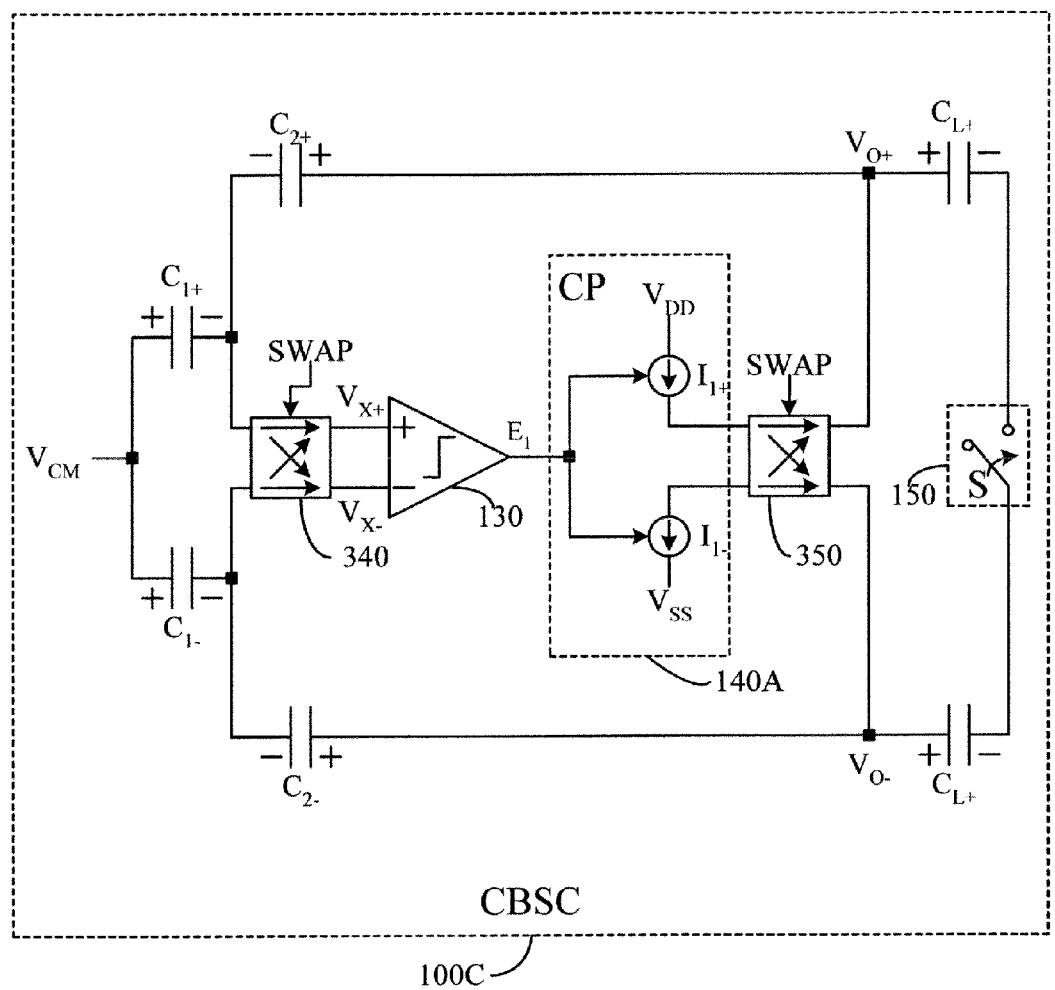
FIG. 6 depicts an alternative differential circuit embodiment of a CBSC circuit during a transfer phase in accordance with the present invention.

FIG. 6 depicts an alternative embodiment of a differential circuit CBSC 100C during the transfer phase. Instead of reversing a polarity of connection for capacitors, one reverses a polarity of connection for comparator 130 and an output of charge pump circuit CP 140A whenever the SWAP signal is asserted. Again, the charges stored on $C_{1+}/C_{1-}$ are transferred to a pair of integrating capacitors $C_{2+}/C_{2-}$ using the differential charge pump circuit CP 140A. The transfer phase comprises three sub-phases: preset (P), coarse charge transfer ($E_1$), and hold (H). Although a fine transfer phase $E_2$ is not included here, those of ordinary skill in the art may include a fine transfer phase by adding a current source $I_{2+}$ and a current sink $I_{2-}$ that are both controlled by $E_2$. During preset (P), $V_{O+}$ is pulled to $V_{SS}$ and $V_{O-}$ is pulled to $V_{DD}$ if SAWP=0, otherwise $V_{O+}$ is pulled to $V_{DD}$ and $V_{O-}$ is pulled to $V_{SS}$. In either case, one ensures $V_{X+} < V_{X-}$ before entering coarse charge transfer ($E_1$). During coarse charge transfer ($E_1$), CP 140A injects charge into $V_{O+}$ (when SWAP=0) or $V_{O-}$ (when SWAP=1) and drains charge from $V_{O-}$ (when SWAP=0) or $V_{O+}$ (when SWAP=1) until comparator 130 detects $V_{X+} > V_{X-}$. Instead of shuffling a polarity of connection for capacitors, one shuffles a polarity of connection for comparator 130 using shuffler 340 and a polarity of connection for charge pump 140A using shuffler 350. It is clear that CBSC 100C has a lower complexity than CBSC 100B and thus is more favorable.

Throughout this disclosure, there are many switches (besides switch 150) that are needed but not displayed in any of the figures. They are controlled by a plurality of clock signals to define the circuit configuration (i.e. the connections among circuit elements) for both sampling phase ($\phi_1$) and the transfer phase ($\phi_2$). They are not shown in the figures because they are implied and deemed obvious to those of ordinary skill in the art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A comparator based switch capacitor (CBSC) circuit comprising: a comparator, a charge pump, a plurality of capacitors, and a plurality of shufflers, wherein each shuffler is controlled by a logical signal to determine a polarity of connection for a circuit element within the CBSC circuit such that an error due to circuit delay between the comparator and the charge pump is reduced, wherein the CBSC circuit operates at a sampling phase and a transfer phase, wherein: during the sampling phase the CBSC circuit samples an input signal; during the transfer phase the CBSC circuit amplifies the sampled input signal by a ratio and transfers a first resultant signal to a load using the charge pump circuit.

2. The circuit of claim 1, wherein the circuit element is a capacitor among said capacitors.

3. The circuit of claim 1, wherein the circuit element is the comparator.

4. The circuit of claim 1, wherein the circuit element is the charge pump.

5. The circuit of claim 1, wherein the logical signal is an alternating sequence.

6. The circuit of claim 1, wherein the logical signal is a pseudo-random sequence.

7. The circuit of claim 1, wherein said capacitors comprise a sampling capacitor used to sample the input signal during the sampling phase.

8. The circuit of claim 7, wherein the sampling capacitor is coupled to the comparator during the transfer phase.

9. The circuit of claim 7, wherein said capacitors further comprise an integrating capacitor coupled to the charge pump during the transfer phase.

10. The circuit of claim 1, wherein the load comprises a load capacitor.

11. A method of spectrally shaping a circuit noise induced in a comparator based switch capacitor (CBSC) comprising a comparator, a charge pump, and a plurality of capacitors, the method comprising:
- generating a logical signal;
- sampling an input signal during a sampling phase;
- amplifying the sampled input signal by a ratio; and
- transferring a resultant signal to a load using a charge pump circuit during a transfer phase using a configuration of connection of a circuit element, wherein the configuration is controlled by the logical signal such that an error due to circuit delay between the comparator and the change pump is reduced.

12. The method of claim 11, wherein the circuit element is a capacitor among said capacitors.

13. The method of claim 11, wherein the circuit element is the comparator.

14. The method of claim 11, wherein the circuit element is the charge pump.

15. The method of claim 11, wherein the logical signal is an alternating sequence.

16. The method of claim 11, wherein the logical signal is a pseudo-random sequence.

17. The method of claim 11, wherein said capacitors comprise a sampling capacitor used to sample the input signal during the sampling phase.

18. The method of claim 17, wherein the sampling capacitor is coupled to the comparator during the transfer phase.

19. The method of claim 17, wherein said capacitors further comprise an integrating capacitor coupled to the charge pump during the transfer phase.

20. The method of claim 11, wherein the load comprises a load capacitor.

* * * * *